(12) United States Patent
Matsuyama

(10) Patent No.: US 9,947,537 B2
(45) Date of Patent: Apr. 17, 2018

(54) METHOD OF FORMING A P-TYPE OHMIC CONTACT IN GROUP-III NITRIDE SEMICONDUCTORS

(71) Applicant: FUJI ELECTRIC CO., LTD., Kanagawa (JP)

(72) Inventor: Hideaki Matsuyama, Hino (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/609,040

(22) Filed: May 31, 2017

(65) Prior Publication Data

US 2018/0019129 A1    Jan. 18, 2018

(30) Foreign Application Priority Data

Jul. 12, 2016 (JP) .................. 2016-138044

(51) Int. Cl.
| | |
|---|---|
| H01L 21/22 | (2006.01) |
| H01L 21/225 | (2006.01) |
| H01L 29/66 | (2006.01) |

(52) U.S. Cl.
CPC .... *H01L 21/2258* (2013.01); *H01L 29/66522* (2013.01); *H01L 29/66666* (2013.01)

(58) Field of Classification Search
CPC . H01L 21/22; H01L 21/2233; H01L 21/2258; H01L 29/66522; H01L 29/66666
See application file for complete search history.

(56) References Cited

U.S. PATENT DOCUMENTS

2008/0090395 A1    4/2008  Sugimoto et al.
2017/0194478 A1*   7/2017  Ueno ..................... H01L 29/78

FOREIGN PATENT DOCUMENTS

| JP | 2003-197642 A | 7/2003 |
|---|---|---|
| JP | 2008-078332 A | 4/2008 |
| JP | 2011-114017 A | 6/2011 |
| JP | 2012-164718 A | 8/2012 |

* cited by examiner

*Primary Examiner* — Hoai V Pham

(57) ABSTRACT

There is a problem that even if impurities are made to thermally diffuse in a temperature range of 700° C.-1150° C., a good ohmic contact cannot be formed in a p-type group-III nitride semiconductor layer.

Provided is a semiconductor device manufacturing method having a group-III nitride semiconductor substrate and a p-type group-III nitride semiconductor layer on the group-III nitride semiconductor substrate, including forming a magnesium containing layer on and in direct contact with the p-type group-III nitride semiconductor layer; and annealing the p-type group-III nitride semiconductor layer at a temperature more than or equal to 1300° C. to form a p⁺-type region which contains magnesium as an impurity in the p-type group-III nitride semiconductor layer located immediately below the magnesium containing layer.

10 Claims, 22 Drawing Sheets

S40

S110

S114

S158

METHOD OF FORMING A P-TYPE OHMIC CONTACT IN GROUP-III NITRIDE SEMICONDUCTORS

The contents of the following Japanese patent application are incorporated herein by reference: NO. 2016-138044 filed in JP on Jul. 12, 2016.

BACKGROUND

1. Technical Field

The present invention relates to a semiconductor device manufacturing method.

In general, it is difficult to form ohmic contact in group-III nitride semiconductors, in particular, it is difficult to form p-type ohmic contact. Disclosed is the technique for forming the ohmic contact through thermal diffusion of impurities. Japanese Patent Application Publication No. 2008-78332 discloses that p-type and p$^+$-type regions are formed by thermally diffusing Mg as a p-type dopant. The thermal diffusion is conducted in an ammonia atmosphere at 700° C.-1150° C. Japanese Patent Application Publication No. 2012-164718 discloses that a p$^+$ region is formed by thermally diffusing Zn as a p-type dopant. Japanese Patent Application Publication No. 2011-114017 discloses that thermal diffusion is conducted in an oxygen atmosphere at 800° C.-1000° C. by using Mg, Zn, Si, and O as a p-type dopant. Japanese Patent Application Publication No. 2003-197642 discloses that an n-type impurity diffusion region is formed by thermally diffusing n-type impurities in order to obtain a good ohmic contact in group-III nitride semiconductors.

2. Related Art

There is a problem that even if impurities are made to thermally diffuse in a temperature range of 700° C.-1150° C., a good ohmic contact cannot be formed in a p-type group-III nitride semiconductor layer.

SUMMARY

In the first aspect of the present invention, provided is a semiconductor device manufacturing method having a group-III nitride semiconductor substrate and a p-type group-III nitride semiconductor layer. The p-type group-III nitride semiconductor layer may be provided on the group-III nitride semiconductor substrate. The semiconductor device manufacturing method may include forming a magnesium containing layer and forming a p$^+$-type region. The magnesium containing layer may be on and in direct contact with the p-type group-III nitride semiconductor layer. In the forming a p$^+$-type region, the p-type group-III nitride semiconductor layer may be annealed at a temperature more than or equal to 1300° C. to form a p$^+$-type region in the p-type group-III nitride semiconductor layer located immediately below the magnesium containing layer. The p$^+$-type region may contain magnesium as an impurity.

In the annealing, the p-type group-III nitride semiconductor layer may be annealed at a temperature more than or equal to 1500° C.

In the annealing, the p-type group-III nitride semiconductor layer may be annealed at a temperature less than or equal to 2000° C.

After the forming a magnesium containing layer and before the forming a p$^+$-type region, the semiconductor device manufacturing method may further include forming a protective film. The protective film may be formed on the p-type group-III nitride semiconductor layer and the magnesium containing layer.

The protective film may cover an upper surface and side surfaces of the magnesium containing layer and an upper surface of the p-type group-III nitride semiconductor layer.

The protective film may have any one of aluminum nitride, boron nitride and other high melting point materials.

After the forming a p$^+$-type region, the semiconductor device manufacturing method may further include removing the protective film and removing the magnesium containing layer.

The group-III nitride semiconductor substrate may have a threading dislocation density of less than or equal to $10^6$ cm$^{-2}$.

The p$^+$-type region may have a magnesium concentration more than or equal to 1E+18 cm$^{-3}$ and less than or equal to 1E+21 cm$^{-3}$.

The semiconductor device manufacturing method may further include forming an n-type group-III nitride semiconductor layer before the forming a p-type group-III nitride semiconductor layer, forming an n$^+$-type group-III nitride semiconductor layer after a forming the p-type group-III nitride semiconductor layer, forming a pair of n$^+$-type regions after the forming an n$^+$-type group-III nitride semiconductor layer and before a the forming a magnesium containing layer, forming an n-type region after the forming a p$^+$-type region, forming a gate insulating film after the forming an n-type region, forming a gate electrode after the forming a gate insulating film, forming a source electrode after the forming an n-type region and forming a drain electrode after the forming an n-type region.

The n-type group-III nitride semiconductor layer may be formed between the group-III nitride semiconductor substrate and the p-type group-III nitride semiconductor layer. The n$^+$-type group-III nitride semiconductor layer may be formed on the p-type group-III nitride semiconductor layer. The pair of n$^+$-type regions may be formed by partially removing the n$^+$-type group-III nitride semiconductor layer on a further inner side than the pair of p$^+$-type regions in a cross section perpendicular to a front surface of the semiconductor layer. The n-type region may be formed in the p-type group-III nitride semiconductor layer. The n-type region may be formed by implanting n-type impurities into a position in the p-type group-III nitride semiconductor layer which is between the pair of n$^+$-type regions and is other than the p$^+$-type regions. The gate insulating film may be formed on the n-type region. The gate electrode may be on and in direct contact with the gate insulating film. The source electrode may electrically connect to the pair of n$^+$-type regions and the p$^+$-type regions. The drain electrode may be under and in direct contact with the group-III nitride semiconductor substrate.

Note that the summary clause does not necessarily describe all necessary features of the embodiments of the present invention. The present invention may also be a sub-combination of the features described above.

BRIEF DESCRIPTION OF THE DRAWINGS

FIG. 6I shows a diagram illustrating the step S156.

DESCRIPTION OF EXEMPLARY EMBODIMENTS

Hereinafter, the present invention will be described through the embodiments of the invention. However, the following embodiments do not limit the invention according to the claims. Also, all of the combinations of the features described in the embodiments are not necessarily essential for means for solving the problem of the invention.

Figure 1:
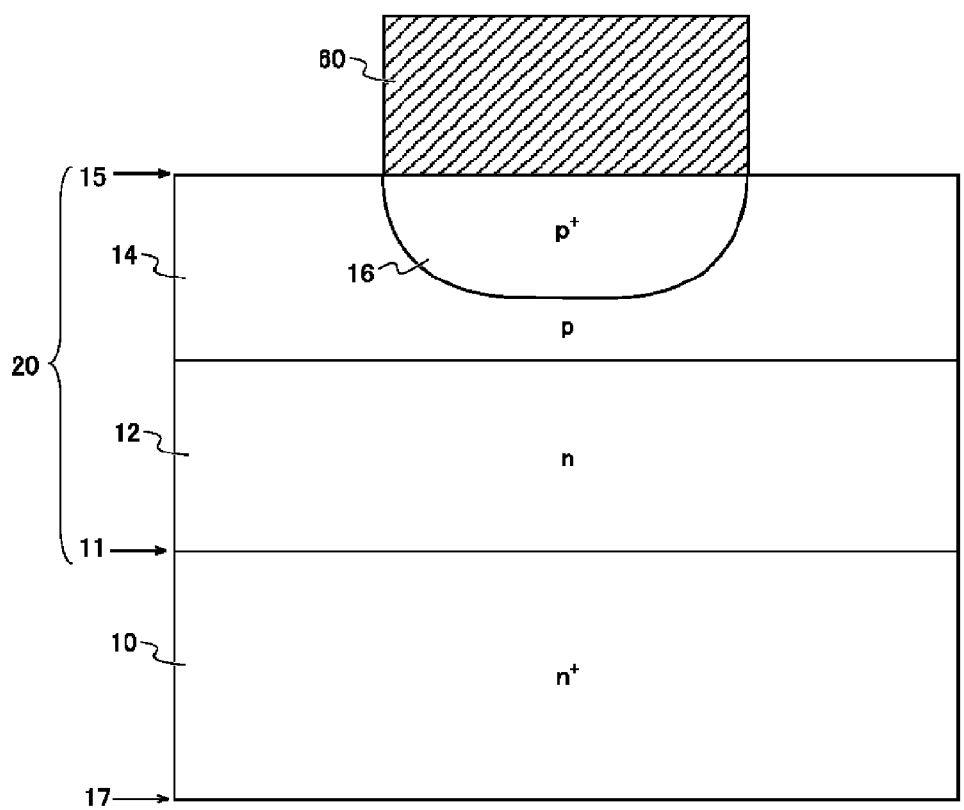
FIG. 1 shows a schematic view illustrating a cross section of an ohmic contact structure 100 according to the first embodiment.

FIG. 1 is a schematic view illustrating a cross section of an ohmic contact structure 100 according to the first embodiment. The ohmic contact structure 100 may be a part of a semiconductor device using a group-III nitride semiconductor. The group-III nitride semiconductor of this example is gallium nitride (hereinafter, described as GaN). However, the group-III nitride semiconductor may further include one or more of Al (aluminum) and In (indium). The group-III nitride semiconductor may be $Al_xIn_yGa_{(1-x-y)}N$ (where $0 \leq x \leq 1$, $0 \leq y \leq 1$).

The ohmic contact structure 100 of this example includes an $n^+$-type GaN substrate 10 as a group-III nitride semiconductor substrate, a GaN layer 20 and an electrode 60. The GaN layer 20 of this example is a homoepitaxial layer provided on and in direct contact with the $n^+$-type GaN substrate 10. The GaN layer 20 of this example has an n-type GaN layer 12 and a p-type GaN layer 14 as a p-type group-III nitride semiconductor layer. The p-type GaN layer 14 may be provided on and in direct contact with the n-type GaN layer 12.

The $n^+$-type GaN substrate 10 of this example is a self-standing substrate. The $n^+$-type GaN substrate 10 may be a seed crystal in the subsequent epitaxial process. In this example, a boundary between the $n^+$-type GaN substrate 10 and the GaN layer 20 is a boundary 11. In this example, a principal surface of the $n^+$-type GaN substrate 10, which is opposite to the boundary 11 is a back surface 17, and a principal surface of the GaN layer 20, which is opposite to the boundary 11 is a front surface 15.

In this example, the direction from the back surface 17 of the $n^+$-type GaN substrate 10 toward the front surface 15 of the GaN layer 20 is defined as an "upper" direction. Also, "lower" direction means the opposite direction of the "upper" direction. The "upper" and "lower" directions do not necessarily mean the vertical direction to the ground. The terms "upper" and "lower" are merely the representations of convenience that specify the relative positional relationship among the substrate, layer, film and the like.

The p-type GaN layer 14 of this example has a $p^+$-type region 16. The $p^+$-type region 16 is a region in which p-type impurities are diffused in a high concentration (more than or equal to 1E+18 $cm^{-3}$) (high-concentration impurity diffusion region). Note that the letter E means a power of 10. For example, E+18 means $10^{18}$. The $p^+$-type region 16 may provide an ohmic contact between the GaN layer 20 and the electrode 60. The p-type GaN layer 14 of this example may have a well shape. The uppermost part of the p-type GaN layer 14 may be exposed to the front surface 15. The uppermost part of the $p^+$-type region 16 may form an alloy layer with the electrode 60.

The n-type impurities for the group-III nitride semiconductor may be one or more of Si (silicon), Ge (germanium) and O (oxygen). Also, the p-type impurities for the group-III nitride semiconductor may be one or more of Mg (magnesium), Hg (mercury), Be (berylium) and Zn (zinc).

The inventors of this application understand that the p-type impurities are not diffused in a solid phase into the epitaxially formed p-type GaN layer 14 in the temperature range of less than 1300° C. (for example, 1150° C.). That is because a diffusion distance of the p-type impurities is short. The annealing treatment at 1150° C. was applied to a sample obtained by growing GaN layers doped with a high concentration-Mg on an undoped GaN layer, and then a Mg concentration distribution in a depth direction was measured by a SIMS analyze (a secondary ion mass spectrometry) for these layers. As a result, the diffusion distance of Mg is 30 nm, which is very short.

In this example, in annealing (FIG. 3D described later), p-type impurities are diffused in a solid phase into the group-III nitride semiconductor substrate, and the diffused p-type impurities are activated and made to function as an acceptor. Because for Hg, Be and Zn among the p-type impurities, an activation energy in the group-III nitride semiconductor substrate is higher than that of Mg, it is difficult to make them function as an acceptor even if they could be diffused into the group-III nitride semiconductor substrate. Therefore, Mg is preferable to Hg, Be and Zn as a p-type impurity. For this example, Mg is used as a p-type impurity.

Figure 2:
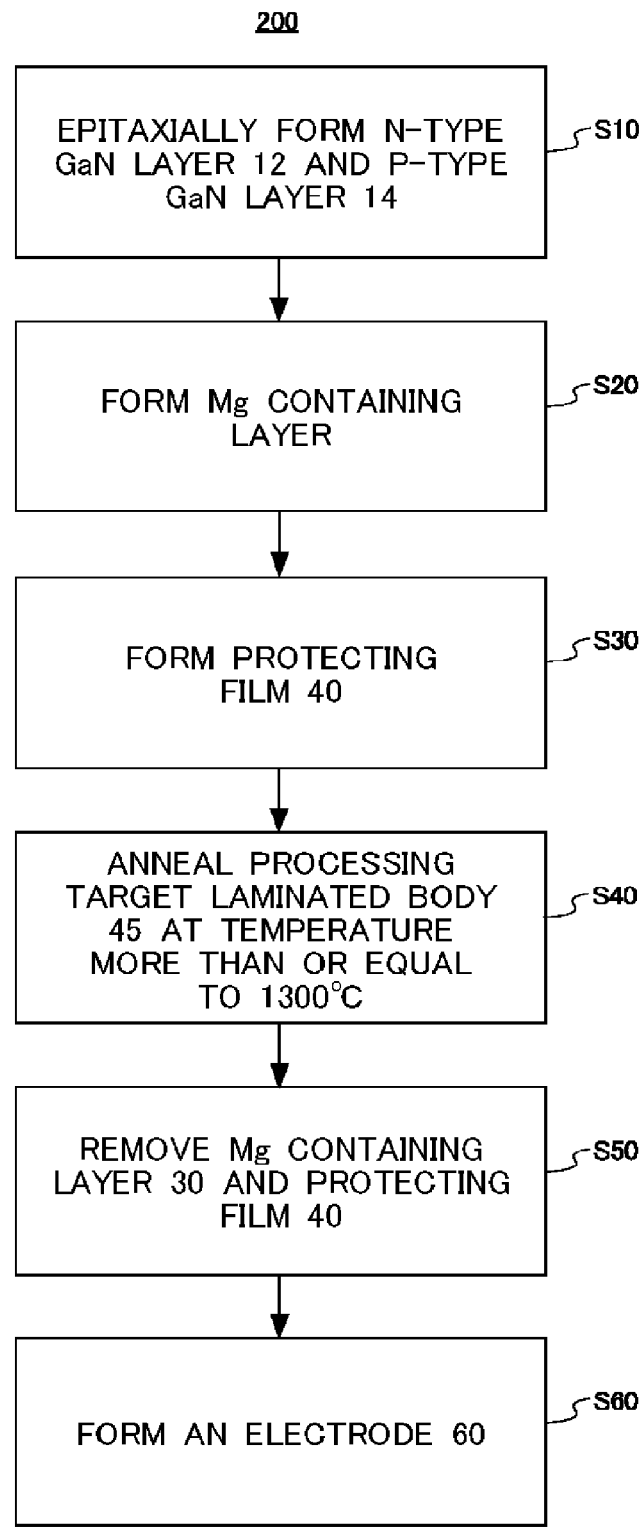
FIG. 2 shows a flow diagram illustrating a manufacturing method 200 of the ohmic contact structure 100.

FIG. 2 is a flow diagram illustrating a manufacturing method 200 of an ohmic contact structure 100. Manufacturing process of this example is performed sequentially from step S10 to S60. The Manufacturing process of this example includes epitaxially forming an n-type GaN layer 12 and a p-type GaN layer 14 (S10), forming a magnesium containing layer (hereinafter, described as Mg containing layer 30) (S20), forming a protective film 40 (S30), annealing a processing target laminated body 45 at a temperature more than or equal to 1300° C. (S40), removing the Mg containing layer 30 and the protective film 40 (S50) and forming an electrode 60 (S60).

Figure 3A:
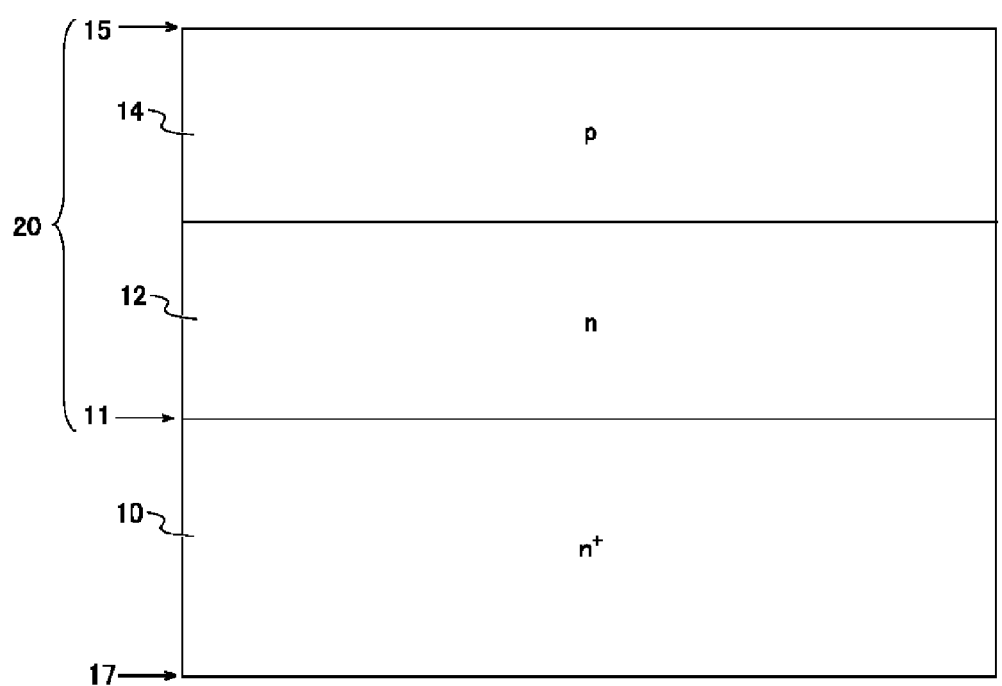
FIG. 3A shows a diagram illustrating the step S10.

FIG. 3A is a diagram illustrating the step S10. In the step S10, the n-type GaN layer 12 is epitaxially formed on the $n^+$-type GaN substrate 10 by the metalorganic chemical vapor deposition method (MOCVD). In one example, raw material gas containing trimethylgallium ($Ga(CH_3)_3$), ammonia ($NH_3$) and monosilane ($SiH_4$) and pressing gas containing nitrogen ($N_2$) and hydrogen ($H_2$) are flowed over the high temperature $n^+$-type GaN substrate 10. Si of $SiH_4$ functions as an n-type impurity. Note that types of the raw material gas and the pressing gas are not limited to the above-described example.

Then, the p-type GaN layer 14 is epitaxially formed on the n-type GaN layer 12 by the MOCVD. In one example, a raw material gas containing trimethylgallium, ammonia and bis-cyclopentadienyl magnesium ($Cp_2Mg$) and a pressing gas containing nitrogen ($N_2$) and hydrogen ($H_2$) are flowed over the high temperature n-type GaN layer 12. Mg of $Cp_2Mg$ functions as a p-type impurity. Note that types of the raw material gas and the pressing gas are not limited to the above-described example.

Figure 3B:
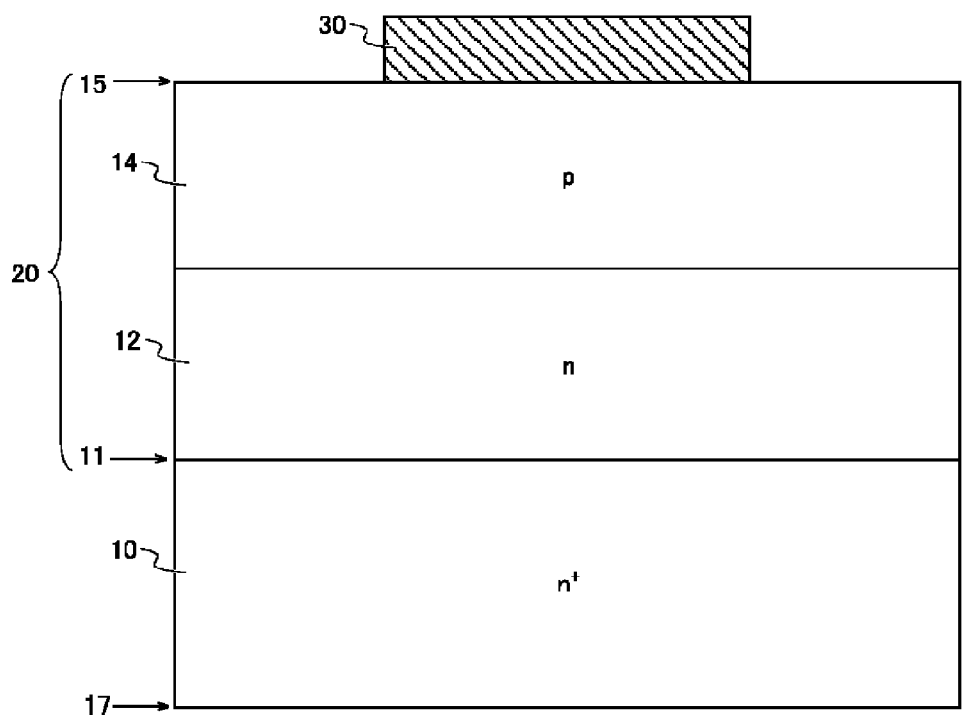
FIG. 3B shows a diagram illustrating the step S20.

FIG. 3B is a diagram illustrating the step S20. In the step S20, a Mg containing layer 30 is formed to be on and in direct contact with the p-type GaN layer 14. After the Mg containing layer 30 is formed all over the front surface 15, the Mg containing layer 30 is patterned in a predetermined shape through a photolithographic process. The predetermined shape may correspond to the shape of the $p^+$-type region 16 on the front surface 15, in particular, it may have a similar shape to the $p^+$-type region 16. In FIG. 3B, the Mg containing layer 30 after the patterning is illustrated.

Mg of the Mg containing layer 30 diffuses in a solid phase from the Mg containing layer 30 to the p-type GaN layer 14 in the annealing (S40) described later. The Mg containing layer 30 functions as a solid impurity source for forming the $p^+$-type region 16. In this example, because the Mg containing layer 30 is shaped in a predetermined shape, with the region in which Mg is doped being limited, the $p^+$-type region 16 can be formed more easily compared with the case in which the $p^+$-type layer is epitaxially formed,. Note that a crystal quality of the p-type GaN layer 14 deteriorates when high concentration p-type impurities are ion-implanted into the p-type GaN layer 14. In this example, the deterioration in the crystal quality of the p-type GaN layer 14 due to the ion implantation can be prevented because the Mg containing layer 30 is formed by thermal diffusion.

The Mg containing layer 30 may be an alloy layer containing Mg or a compound layer containing Mg. However, a surface of the alloy layer containing Mg may be oxidized because Mg is easily oxidized. Furthermore, a protective metal film may be laminated on the Mg containing layer 30. In one example, the alloy layer containing Mg and Zr may be formed all over the front surface 15 by an evaporation method, a sputtering method or an ion plating method. Note that the temperature of the GaN layer 20 may be in a temperature range more than or equal to a room temperature and less than or equal to 200° C. when the Mg containing layer 30 is formed all over the front surface 15.

The alloy layer containing Mg may be Mg—Ni alloy, Mg—Ti alloy, Mg—Zr alloy, Mg—W alloy or Mg-rare earth element alloy obtained by adding Mg to a high melting point metal. The compound layer containing Mg may be Mg(OH) (magnesium hydroxide) or $Mg(NO_3)_2$ (magnesium nitrate).

Figure 3C:
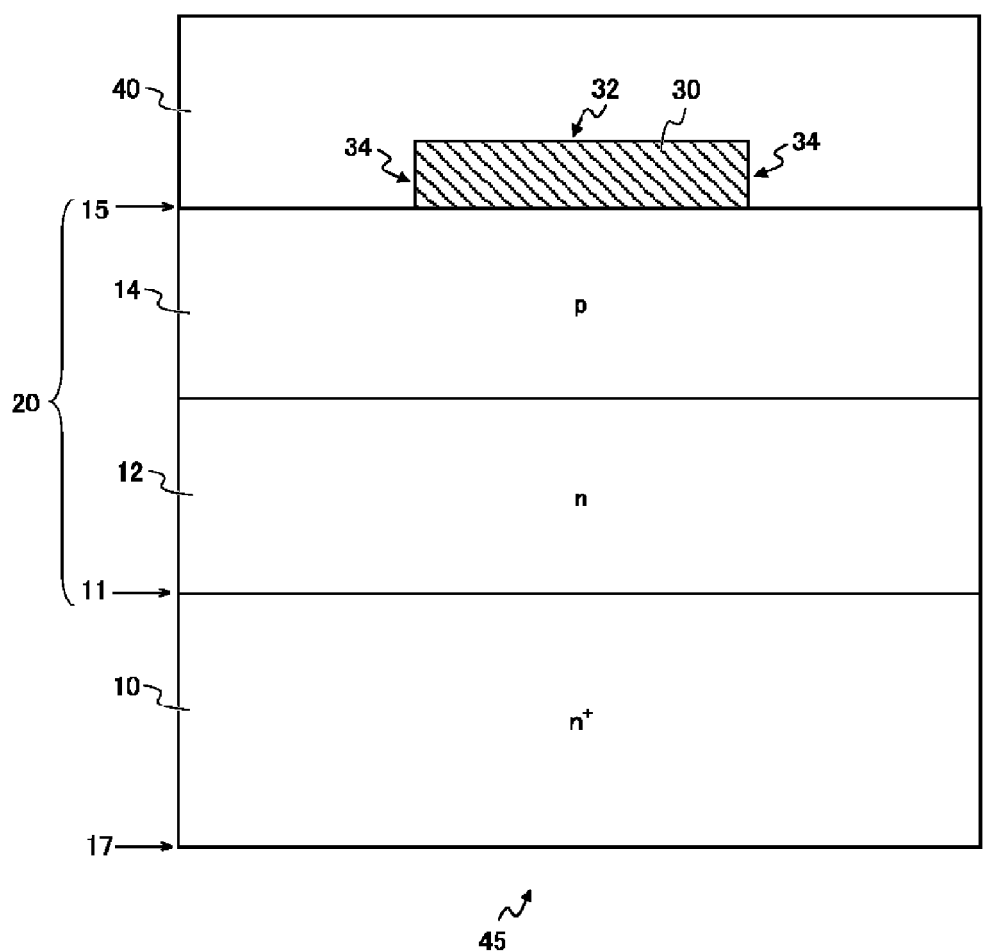
FIG. 3C shows a diagram illustrating the step S30.

FIG. 3C is a diagram illustrating the step S30. In the step S30, a protective film 40 is formed on the p-type GaN layer 14 and the Mg containing layer 30. In addition, the protective film 40 may be further formed in direct contact with the back surface 17 of the $n^+$-type GaN substrate 10. As a result, a processing target laminated body 45 is formed, which has the $n^+$-type GaN substrate 10, the GaN layer 20, the Mg containing layer 30 and the protective film 40. The protective film 40 may have any one of AlN (aluminum nitride), BN (boron nitride) and other high melting point materials. The high melting point material may be WC (tungsten carbide), $Al_2O_3$ (aluminum oxide), W (tungsten), Zr (zirconium) or Pt (platinum).

The protective film 40 may have a function of preventing the Mg containing layer 30 from pyrolyzing and evaporating. The protective film 40 of this example covers an upper surface 32 and side surfaces 34 of the Mg containing layer 30, so that pyrolyzing and evaporating of the Mg containing layer 30 can be prevented compared with a case in which the protective film 40 is not present and a case in which the protective film 40 covers the upper surface 32 of the Mg containing layer 30 only. Therefore, Mg can be diffused in a solid phase into the p-type GaN layer 14 more surely.

It is preferable that the protective film 40 has high heat resistance and a good adhesive property with the p-type GaN layer 14, impurities are not diffused from the protective film 40 to the p-type GaN layer 14 and the protective film 40 can be selectively removed from the p-type GaN layer 14. The protective film 40 having high heat resistance means that the protective film 40 does not substantially decompose to the extent that a pit (through opening) is not formed in the protective film 40 even when it is annealed at a temperature more than or equal to 1300° C. and less than or equal to 2000° C.

The protective film 40 of this example covers an upper surface of the p-type GaN layer 14. Note that the protective film 40 of this example covers all over the front surface 15 of the GaN layer 20 except a contact region of the Mg containing layer 30 with the p-type GaN layer 14. Furthermore, the protective film 40 may be further formed on the back surface 17 of the $n^+$-type GaN substrate 10.

The protective film 40 also has the function of preventing nitrogen from being discharged from the front surface 15 due to pyrolysis. When nitrogen is discharged from the front surface 15 of the GaN layer 20, vacancies are formed on the front surface 15. The protective film 40 can suppress vacancy formation on the front surface 15 by suppressing the discharge of nitrogen from the front surface 15.

Figure 3D:
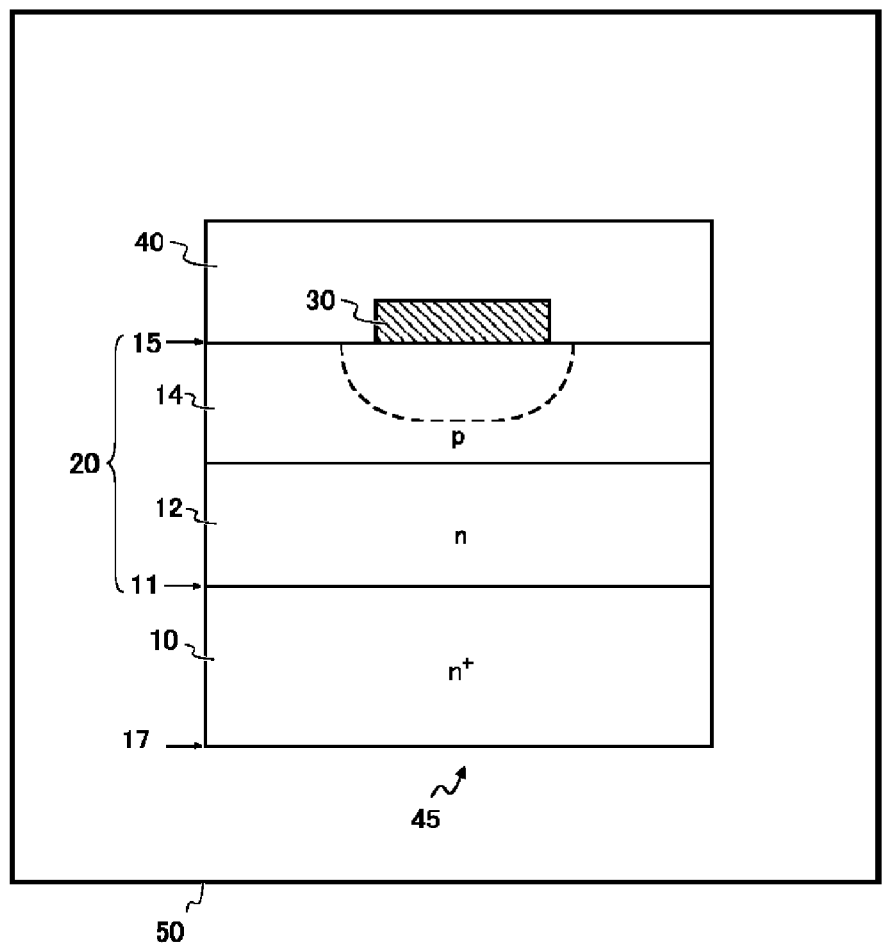
FIG. 3D shows a diagram illustrating the step S40.

FIG. 3D is a diagram illustrating the step S40. In the step S40, the $p^+$-type region 16 is formed by annealing the processing target laminated body 45 at a temperature more than or equal to 1300° C. In this example, the processing target laminated body 45 is annealed at a predetermined temperature more than or equal to 1400° C. and less than or equal to 1500° C. The predetermined temperature may include variation of ±25° C. In the step S40, the $p^+$-type region 16 is formed on the p-type GaN layer 14 located immediately below the Mg containing layer 30. The $p^+$-type region 16 of this example is a region which contains Mg as an impurity.

The annealing of the step S40 is performed with the processing target laminated body 45 being placed within a processing chamber of an annealing apparatus 50. In the annealing of the step S40, Mg can be diffused in a solid phase into the p-type GaN layer 14 and be activated as an acceptor by controlling the temperature of the processing target laminated body 45 at more than or equal to 1300° C. Note that the phrase, temperature of the processing target laminated body 45 may be replaced with the phrase, temperature of the p-type GaN layer 14.

In the step S40, the processing target laminated body 45 may be annealed at a temperature more than or equal to 1350° C., more than or equal to 1400° C., more than or equal to 1450° C. or more than or equal to 1500° C. By annealing at such a high temperature, sufficiently high concentration of Mg can be diffused.

The higher the anneal temperature is, the higher the Mg concentration of the $p^+$-type region 16 becomes. In other words, with increasing anneal temperature, the total number of the Mg atoms which diffuse in a solid phase into the p-type GaN layer 14 increases and the acceptor concentration increases. Therefore, a higher anneal temperature is preferable. However, in this example, a ceiling of the anneal temperature is set in order to prevent the Mg containing layer 30 from melting and nitrogen from discharging from the GaN layer 20.

In the step S40, the processing target laminated body 45 may be annealed at a temperature less than or equal to 2000° C. At a temperature higher than 2000° C., the Mg containing layer 30 could melt and/or evaporate. Therefore, it is preferable that the anneal temperature is less than or equal to 2000° C.

The p$^+$-type region 16 may have the Mg concentration more than or equal to 1E+18 cm$^{-3}$ and less than or equal to 1E+21 cm$^{-3}$. In one example, the Mg concentration at a position within a range from the front surface 15 to the depth of 100 nm may be more than or equal to 1E+18 cm$^{-3}$ and less than or equal to 1E+21 cm$^{-3}$.

The Mg concentration may be 1E+21 cm$^{-3}$ at the front surface 15 (depth of 0 nm), 5E+18 cm$^{-3}$ at a depth position of 100 nm from the front surface 15, 2E+18 cm$^{-3}$ at a depth position of 200 nm from the front surface 15, and 1E+18 cm$^{-3}$ at a depth position of 300 nm from the front surface 15. Note that the depth means the length in the lower direction from the front surface 15. As described above, except the front surface 15, the Mg concentration may decrease exponentially as the depth position becomes lower.

Note that the n$^+$-type GaN substrate 10 of this example has a threading dislocation density less than 10$^7$ cm$^{-2}$. In this case, a dislocation density of the GaN layer 20 is also as low as that of the n$^+$-type GaN substrate 10. In general, the impurities are less apt to diffuse in a solid phase into a semiconductor layer as the threading dislocation density becomes less. However, in this example in which Mg is diffused in a solid phase at a high temperature more than or equal to 1300° C., Mg can be diffused in a solid phase also into the p-type GaN layer 14 having a threading dislocation density less than 10$^7$ cm$^{-2}$. Furthermore, in this example, it is also advantageous in that an element resistance can be reduced even when the threading dislocation densities of the n$^+$-type GaN substrate 10 and the GaN layer 20 are low.

Figure 3E:
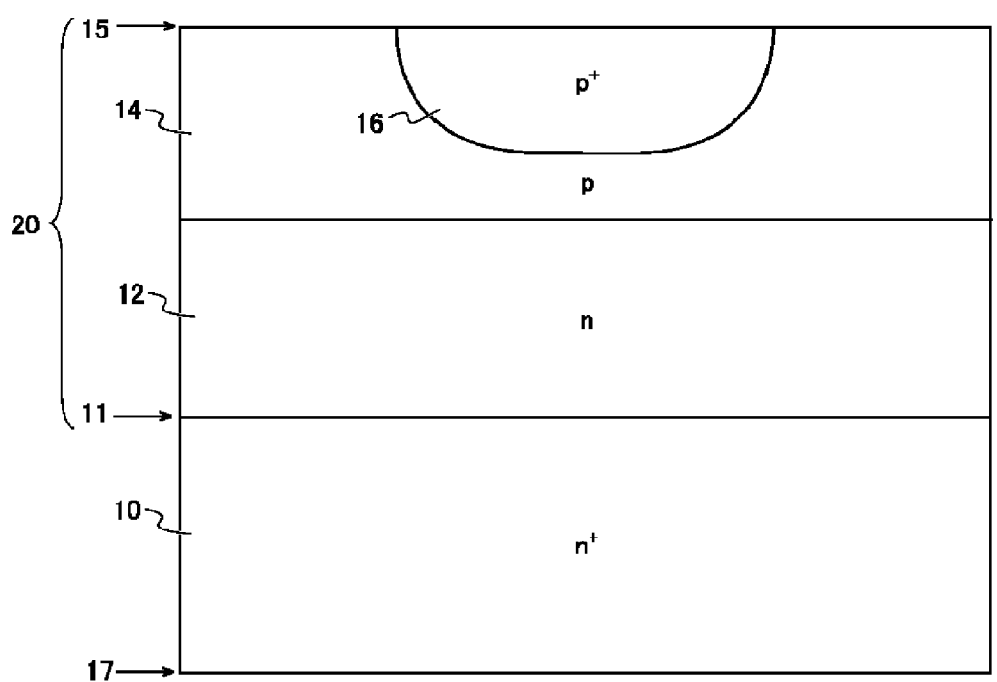
FIG. 3E shows a diagram illustrating the step S50.

FIG. 3E is a diagram illustrating the step S50. In the step S50, the protective film 40 is removed and the Mg containing layer 30 is removed. When the protective film 40 is AlN, the protective film 40 may be removed with molten alkali hydroxide (for example, molten potassium hydroxide). When the protective film 40 is metal, it may be removed with acidic aqueous solution (for example, sulfuric acid, hydrochloric acid or aqua regia). When the protective film 40 is WC, the protective film 40 may be dissolved with sodium nitrate. Because either aqueous solution does not etch the GaN layer 20, the underlying layer is not damaged. When the protective film 40 is BN, it may be removed by dry etching even though the GaN layer 20 suffers damage. The Mg containing layer 30 may be removed with acidic aqueous solution (for example, sulfuric acid, hydrochloric acid or aqua regia) or by dry etching.

Figure 3F:
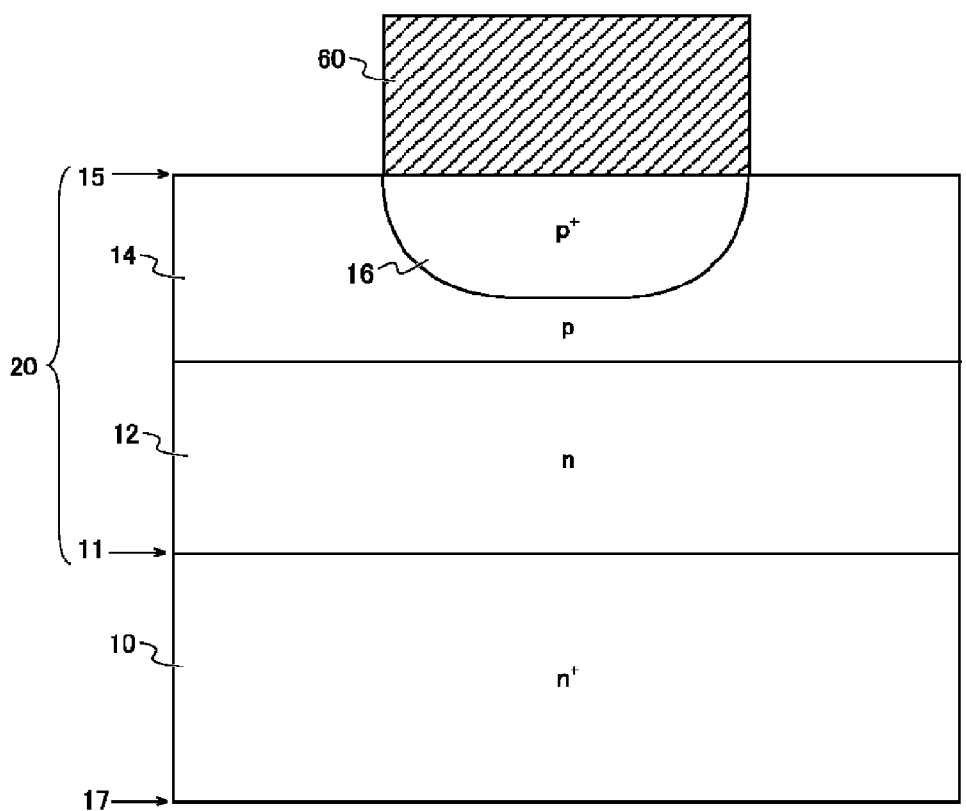
FIG. 3F shows a diagram illustrating the step S60.

FIG. 3F is a diagram illustrating the step S60. In the step S50, after a metal layer is formed all over the front surface 15, the metal layer is patterned in a predetermined shape through a photolithographic process. The metal layer may be platinum (Pt) or palladium (Pd). Furthermore, Ti, Al or the like may be laminated on the metal layer. The predetermined shape may correspond to the shape of the p$^+$-type region 16 on the front surface 15, in particular, it may be the same shape as or a similar shape to the p$^+$-type region 16. In the FIG. 3F, an electrode 60 formed after the metal layer is patterned is illustrated. As a result, the ohmic contact structure 100 is completed.

Figure 4:
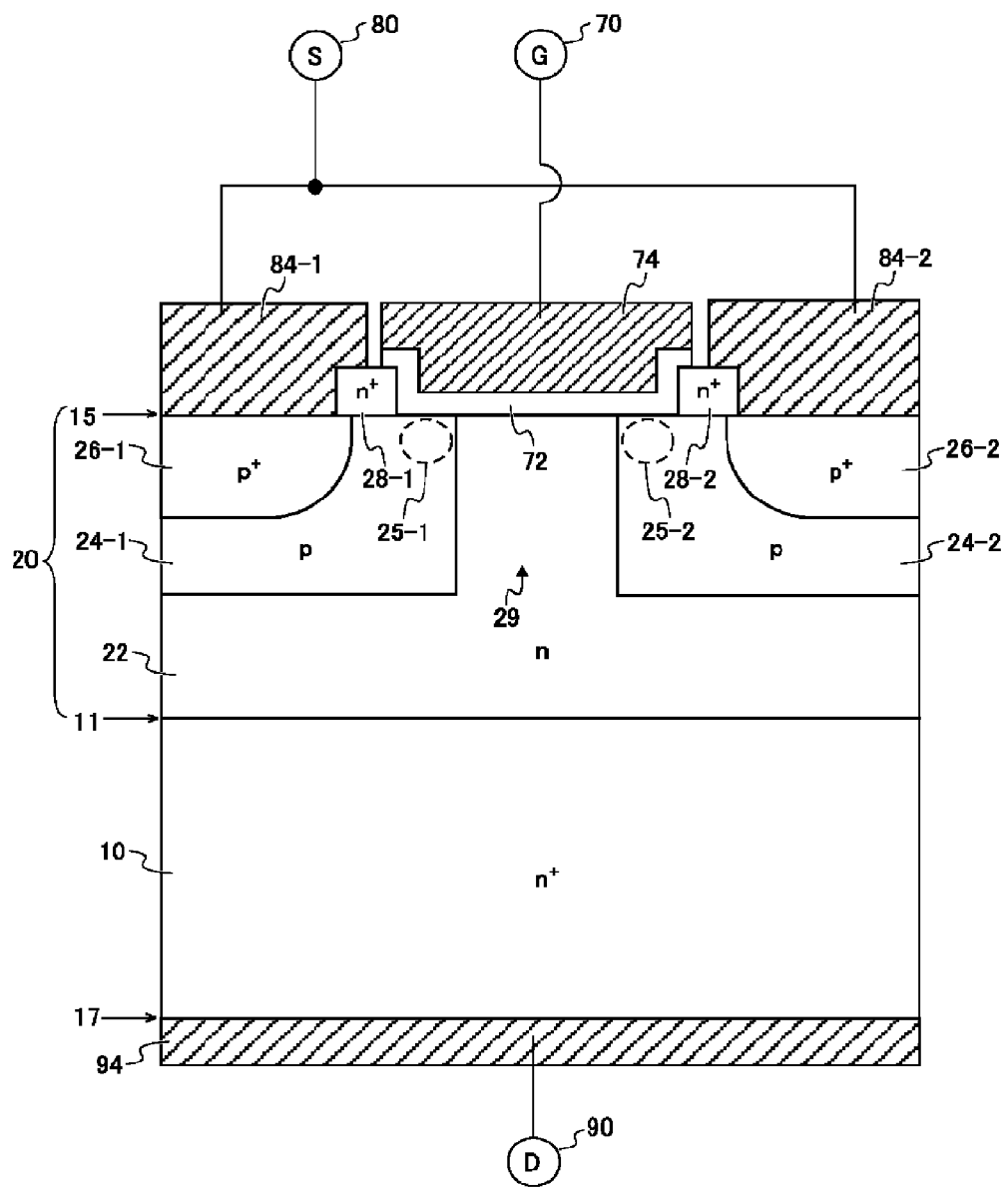
FIG. 4 shows a schematic view illustrating a cross section of a vertical MOSFET 300 according to the second embodiment.

FIG. 4 is a schematic view illustrating a cross section of a vertical MOSFET 300 according to the second embodiment. Note that, FIG. 4 shows a unit structure of the vertical MOSFET 300. The unit structure may be provided in a repetitive manner in the left and right direction of the figure. The vertical MOSFET 300 of this example includes an n$^+$-type GaN substrate 10, a GaN layer 20, a pair of n$^+$-type regions 28, a gate terminal 70, a gate insulating film 72, a gate electrode 74, a source terminal 80, a source electrode 84, a drain terminal 90 and a drain electrode 94. Note that when the vertical MOSFET 300 is seen from above, the n$^+$-type region 28 of this example has a circular shape having straight line portions and curved portions. The cross section of this example is a cross section perpendicular to the front surface 15 of the GaN layer 20 and the straight line portions of the n$^+$-type region 28.

The GaN layer 20 has a lower drift layer 22 of n-type as an n-type group-III nitride semiconductor layer, a p-type GaN layer 24, a pair of p$^+$-type regions 26 and an upper drift region 29 as an n-type region. Note that when the vertical MOSFET 300 is seen from above, the p-type GaN layer 24 and the p$^+$-type region 26 of this example have a circular shape having straight line portions and curved portions. Note that in the cross sectional view of FIG. 4, the p-type GaN layer 24 is spatially separated with the upper drift region 29. In this example, the manufacturing process of the p$^+$-type region 16 of the first embodiment is applied to the vertical MOSFET 300. The lower drift layer 22 may be the same as the n-type GaN layer 12 in the first embodiment.

The p-type GaN layer 24 may be formed by the same method as that for the p-type GaN layer 14 in the first embodiment. The region of the p-type GaN layer 24 immediately below the gate insulating film 72 may function as a channel forming region 25. The p$^+$-type region 26 may be the same as the p$^+$-type region 16 of the first embodiment. The p$^+$-type region 26 may have a function of reducing the contact resistance with the source electrode 84 and a function of providing a hole extracting path during power-off.

The upper drift region 29 is provided between the pair of n$^+$-type regions 28. The upper drift region 29 may be formed continuously with the lower drift layer 22. The n$^+$-type region 28 may function as a source region. For the other components, the same components as in the first embodiment are indicated with the same reference numerals in this example.

The gate terminal 70, the source terminal 80 and the drain terminal 90 are indicated with circled G, D and S, respectively. For example, when the drain electrode 94 has a predetermined high potential and the source electrode 84 has the ground potential, if a potential more than or equal to a threshold voltage is applied to the gate electrode 74 from the gate terminal 70, a charge inversion layer is formed in the channel forming region 25 and a current flows from the drain terminal 90 to the source terminal 80. Furthermore, if a potential less than the threshold voltage is applied to the gate electrode 74, the charge inversion layer in the channel forming region 25 disappears and the current is interrupted.

Figure 5:
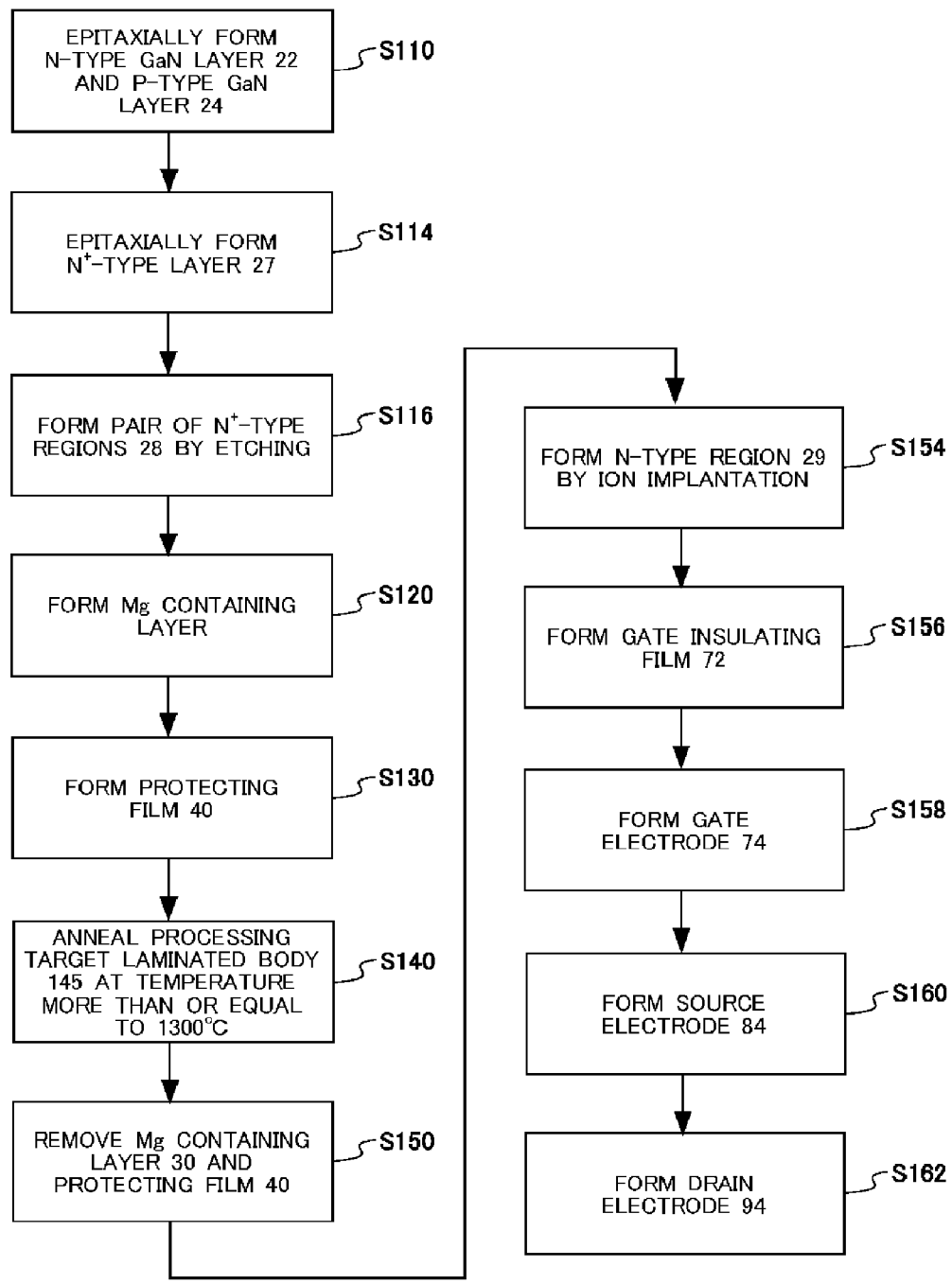
FIG. 5 shows a flow diagram illustrating a manufacturing method 400 of the MOSFET 300.

FIG. 5 is a flow diagram illustrating a manufacturing method 400 of the MOSFET 300. The Manufacturing process of this example is performed sequentially from the step S110 to S162. The step S110, S120, S130, S140, S150 and S160 of this example correspond to the step S10, S20, S30, S40, S50 and S60 of the first embodiment, respectively. Therefore, overlapping description is omitted. The manufacturing process of this example further has the step S114, S116, S154, S156, S158 and S162. Note that details regarding the n+-type GaN layer 27 of the step S114 and a processing target laminated body 145 of the step S140 are described later.

Figure 6A:
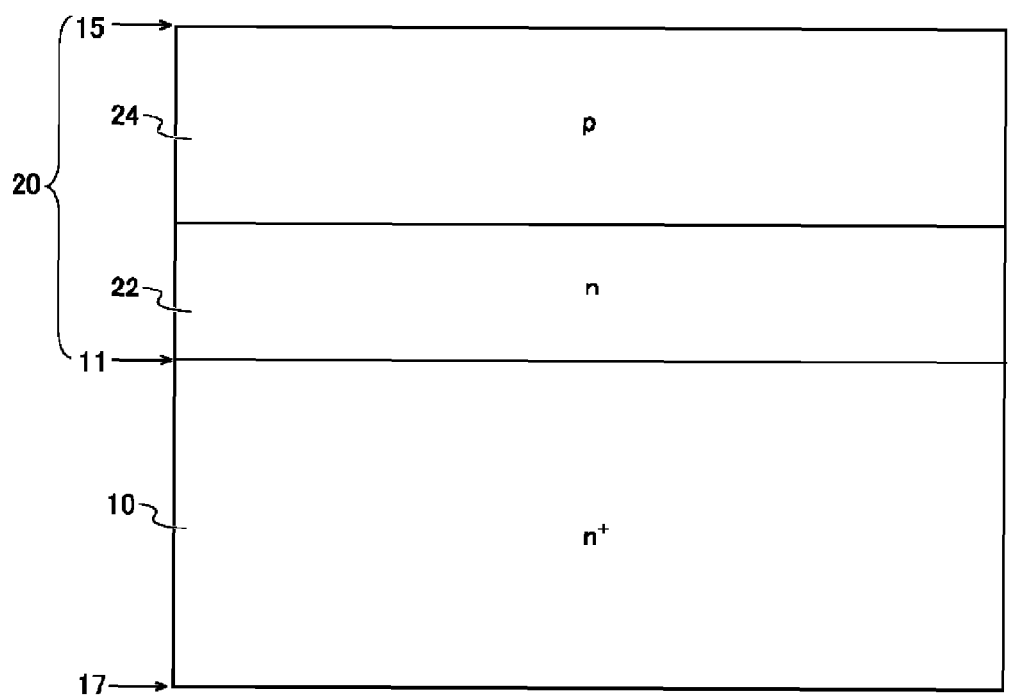
FIG. 6A shows a diagram illustrating the step S110.

FIG. 6A is a diagram illustrating the step S110. In the step S110, the n-type GaN layer 12 and the p-type GaN layer 24 are epitaxially formed on the n+-type GaN substrate 10. Because the step S110 corresponds to the step S10, details are omitted.

Figure 6B:
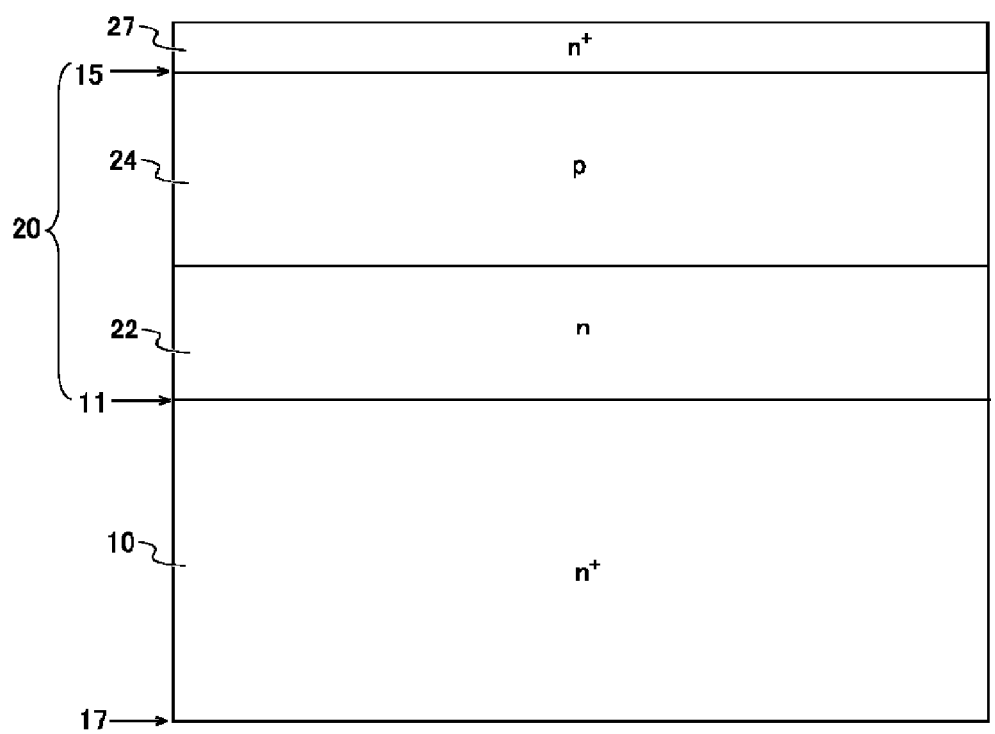
FIG. 6B shows a diagram illustrating the step S114.

FIG. 6B is a diagram illustrating the step S114. In the step S114, the n+-type GaN layer 27 is epitaxially formed to be on and in direct contact with the p-type GaN layer 24. The manufacturing process may be the same as that of the n-type GaN layer 12 in the first embodiment. However, the flow rate of monosilane may be increased compared with the case of forming the n-type GaN layer 12 so that the concentration of the n-type impurities of the n+-type GaN layer 27 is 1E+20 cm$^{-3}$.

Figure 6C:
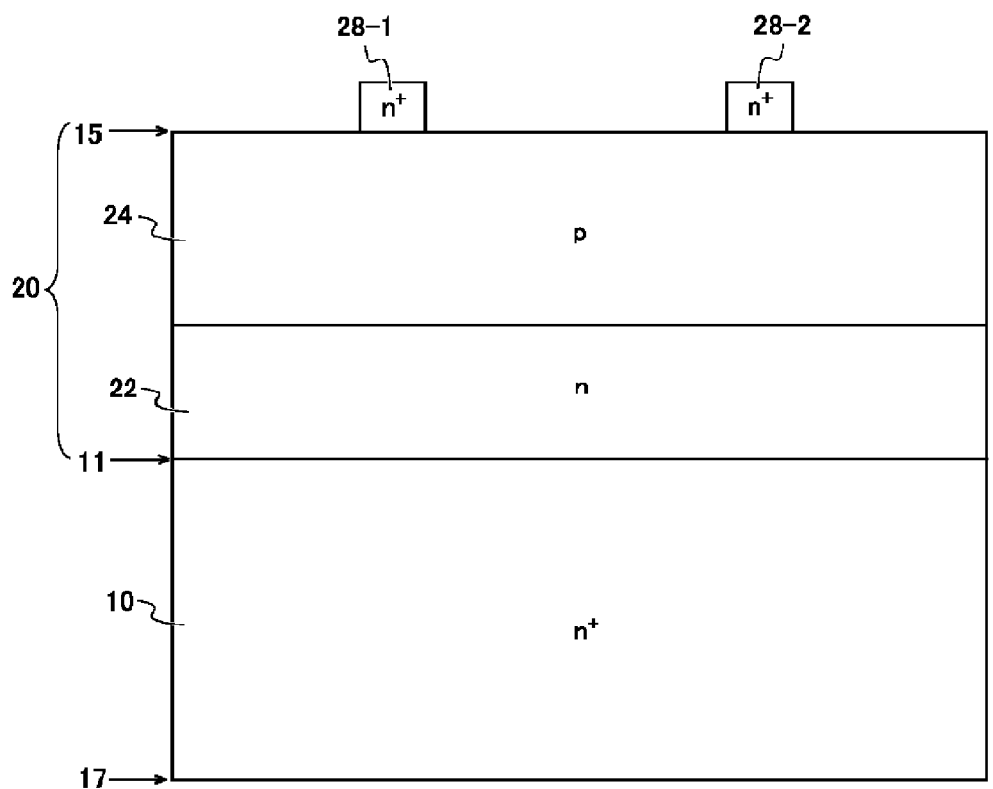
FIG. 6C shows a diagram illustrating the step S116.

FIG. 6C is a diagram illustrating the step S116. In the step S116, a pair of n+-type regions 28 are formed by partially removing the n+-type GaN layer 27.

Figure 6D:
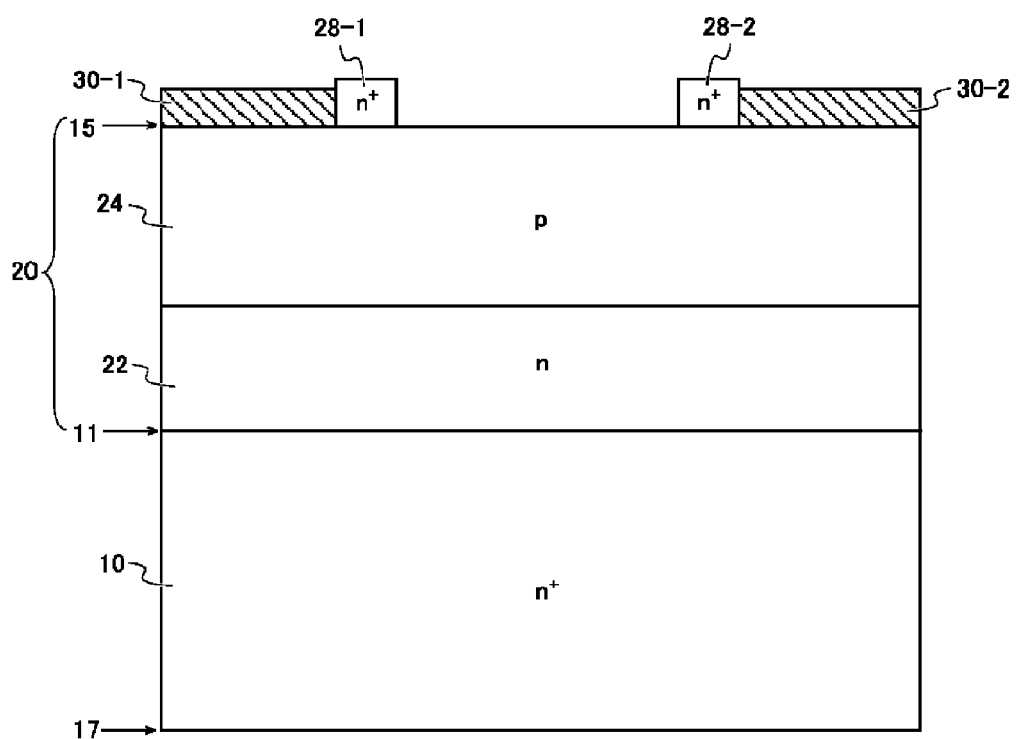
FIG. 6D shows a diagram illustrating the step S120.

FIG. 6D is a diagram illustrating the step S120. In the step S120, a Mg containing layer 30 is formed to be in direct contact with the p-type GaN layer 24 on an outer side of the pair of n+-type regions 28. Note that an inner side is the region between the pair of n+-type regions 28 and the outer side is the opposite side of the inner side relative to the pair of n+-type regions 28. The Mg containing layer 30 of this example is in direct contact with the outer side of the n+-type region 28. The other respects are the same as those of the step S20.

Figure 6E:
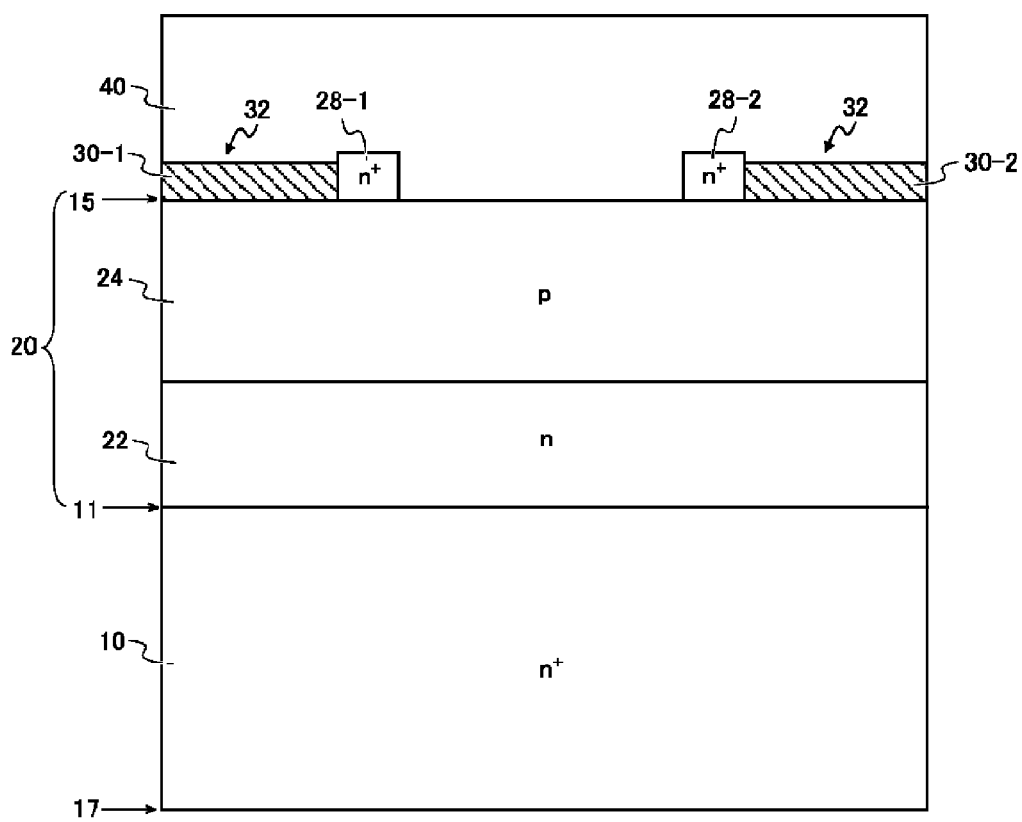
FIG. 6E shows a diagram illustrating the step S130.

FIG. 6E is a diagram illustrating the step S130. In the step S130, a protective film 40 is formed, which covers the p-type GaN layer 24, the pair of n+-type regions 28 and the Mg containing layer 30. The protective film 40 covers all surfaces (the upper surface 32 and side surfaces) of the pair of n+-type regions 28 and the Mg containing layer 30. Note that in FIG. 6E, side surfaces of the Mg containing layer 30 which is covered by the protective film 40 is not shown. The side surface of the Mg containing layer 30 may be an end surface of the Mg containing layer 30 in the direction from the front side to the back side of the paper face of the figure. The other respects are the same as those of the step S30. Furthermore, the protective film 40 may be formed also on the back surface 17 of the n+-type GaN substrate 10.

Figure 6F:
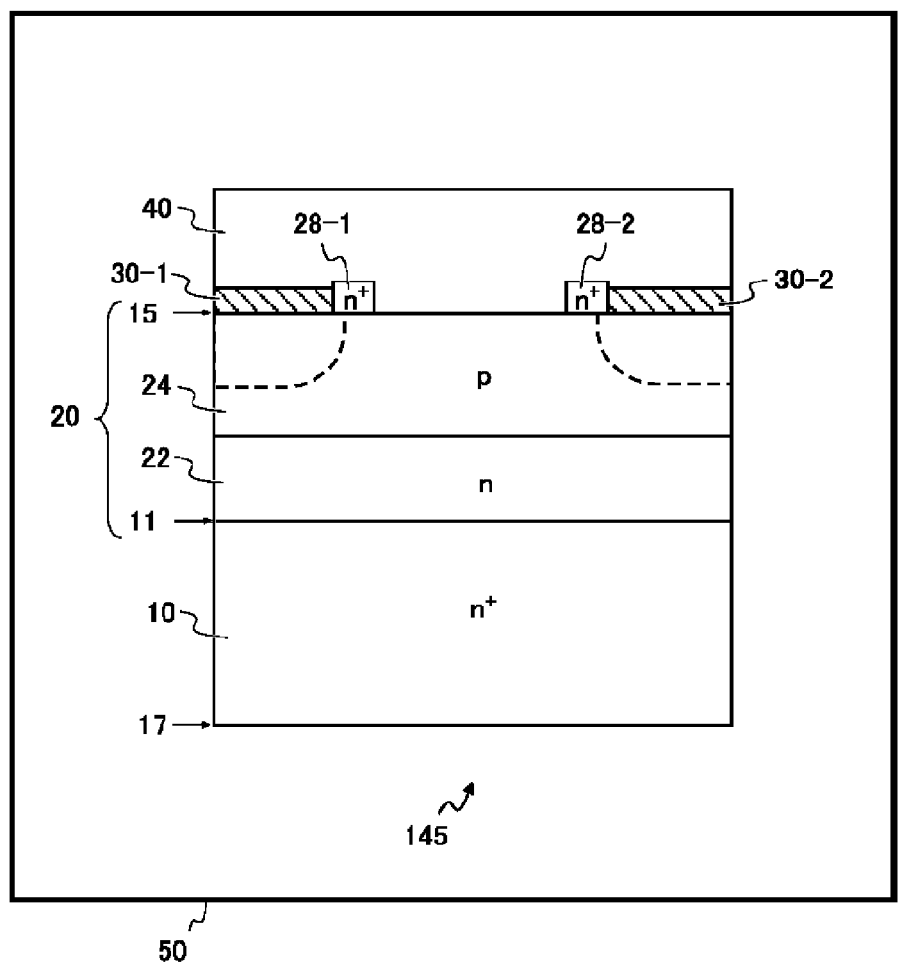
FIG. 6F shows a diagram illustrating the step S140.

FIG. 6F is a diagram illustrating the step S140. In the step S140, the processing target laminated body 145 having the n+-type GaN substrate 10, the GaN layer 20, the pair of n+-type regions 28, the Mg containing layer 30 and the protective film 40 is annealed, so that Mg is diffused in a solid phase into the p-type GaN layer 24. The other respects are the same as those of step S40.

Figure 6G:
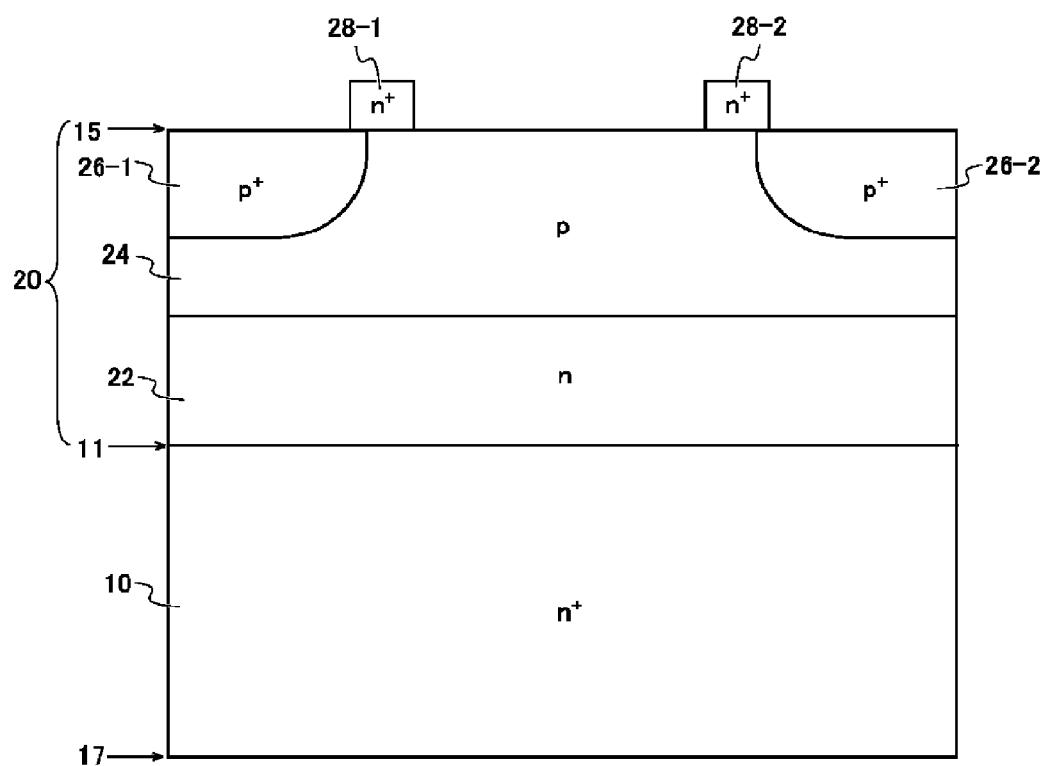
FIG. 6G shows a diagram illustrating the step S150.

FIG. 6G is a diagram illustrating the step S150. In the step S150, the Mg containing layer 30 and the protective film 40 are removed, so that on the front surface 15, the pair of n+-type regions 28 remains on a further inner side than the pair of p+-type regions 26. Note that for each of the pair of n+-type regions 28, at least a part of it needs to be located on the further inner side than the pair of p+-type regions 26. The other respects are the same as those of the step S50.

Figure 6H:
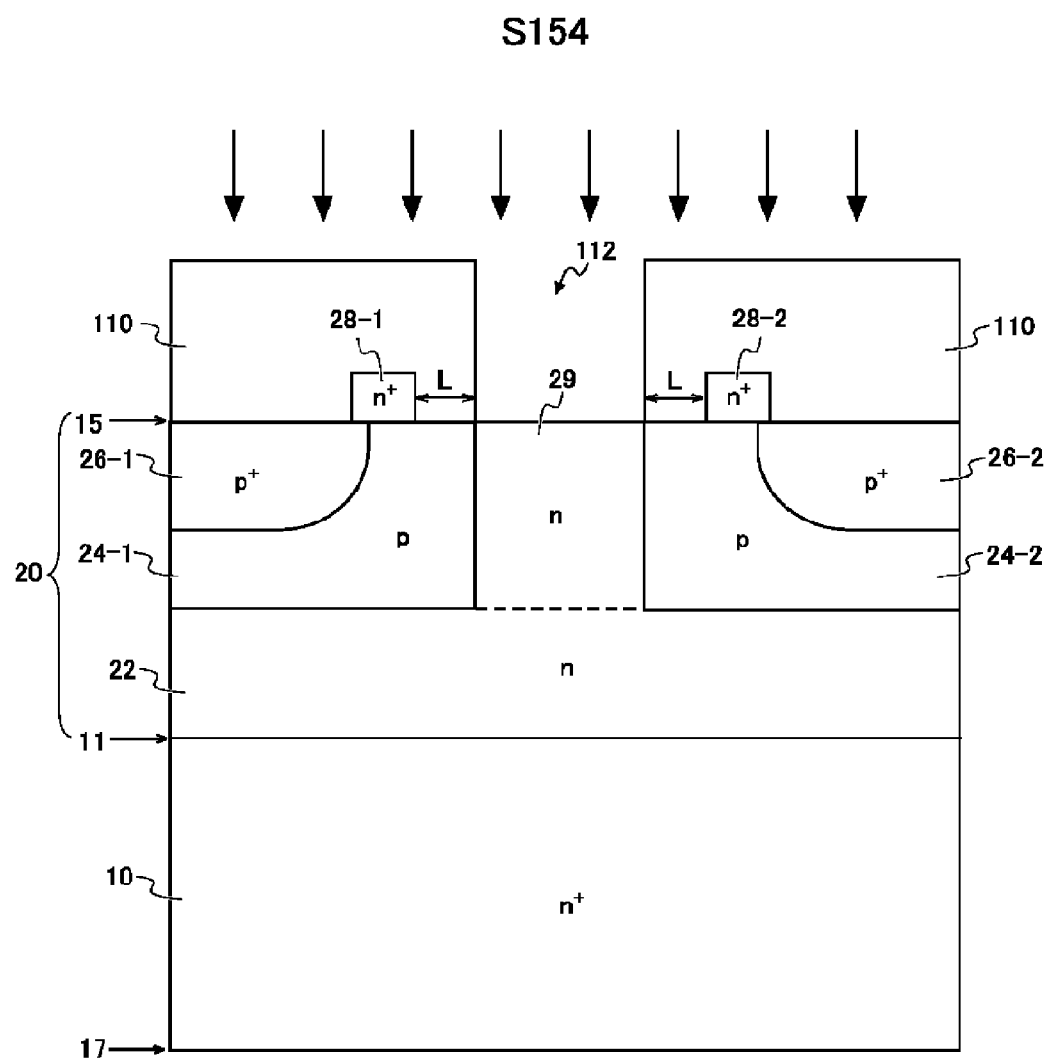
FIG. 6H shows a diagram illustrating the step S154.
Figure 61:
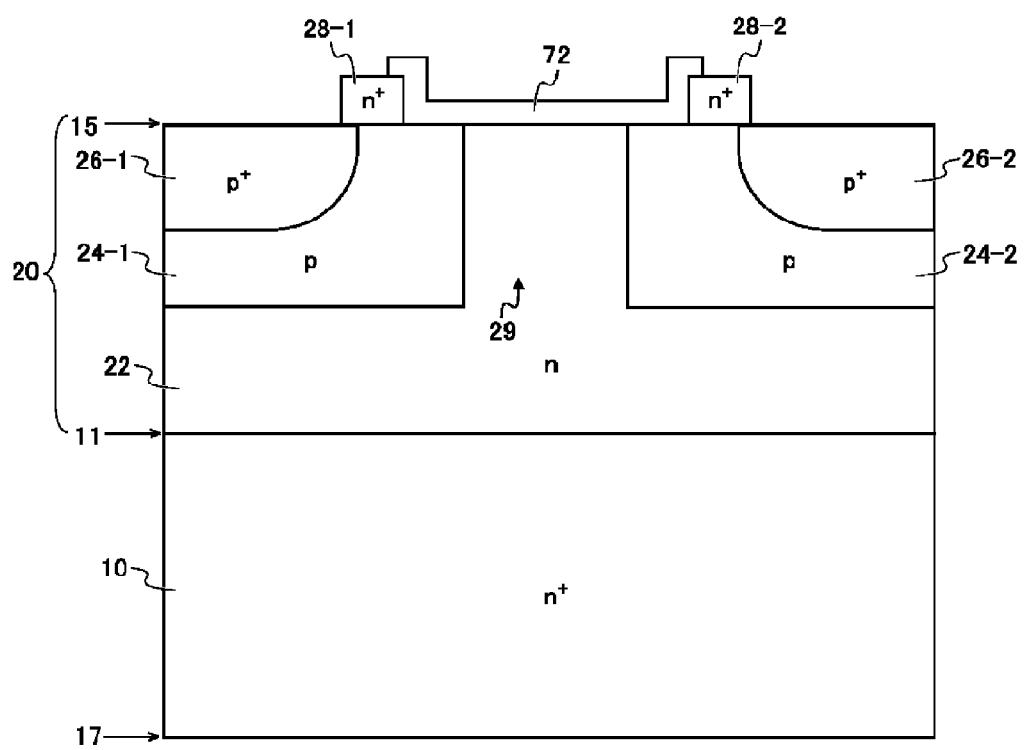

FIG. 6H is a diagram illustrating the step S154. In the step S154, an upper drift region 29 is formed in the p-type GaN layer 24 by implanting the n-type impurities into a position in the p-type GaN layer 24, which is between the pair of n+-type regions 28 and is other than the p+-type region 26. In this example, a photoresist film 110 is formed all over the front surface 15. Thereafter, the photoresist film 110 is patterned to provide an opening 112 at a position separated toward the inner side from the n+-type region 28 by a distance L. The distance L may correspond to the channel length. Thereafter, the n-type impurities such as Si are ion-implanted through the opening 112.

For convenience of description, in FIG. 6H, a boundary between the upper drift region 29 and the lower drift layer 22 is shown by a dotted line. However, the boundary is not required to be observed in the vertical MOSFET 300. Note that, because the ion-implanted n-type impurities need activation annealing, unlike the case with the p-type impurities, an annealing at more than or equal to 1000° C. was performed. As a result, the upper drift region 29 of n-type is formed at the position, which is between the pair of n+-type regions 28 and is other than the p+-type region 26. In addition, persons skilled in the art can appropriately determine the acceleration [keV] and the dose amount [cm$^{-2}$] during the ion implantation according to the depth of the upper drift region 29.

FIG. 6I is a diagram illustrating the step S156. In the step S156, a gate insulating film 72 is formed on the upper drift region 29. The gate insulating film 72 of this example is provided in direct contact with the front surface 15 and the pair of n+-type regions 28. In this example, a silicon dioxide ($SiO_2$) film is formed as the gate insulating film 72 through the low pressure chemical vapor deposition method (LP-CVD). Instead of the $SiO_2$ film, the gate insulating film 72 may be a silicon oxy-nitride (SiON) film, an aluminum oxide ($Al_2O_3$) film, an aluminum oxy-nitride (AlON) film, a magnesium oxide (MgO) film, a gallium oxide ($GaO_x$) film and a silicon nitride (SiN) film, and a laminated film including two or more thereof In this example, a $SiO_2$ film is patterned through a photolithographic process after the $SiO_2$ film is formed. As a result, the gate insulating film 72 is formed.

Figure 6J:
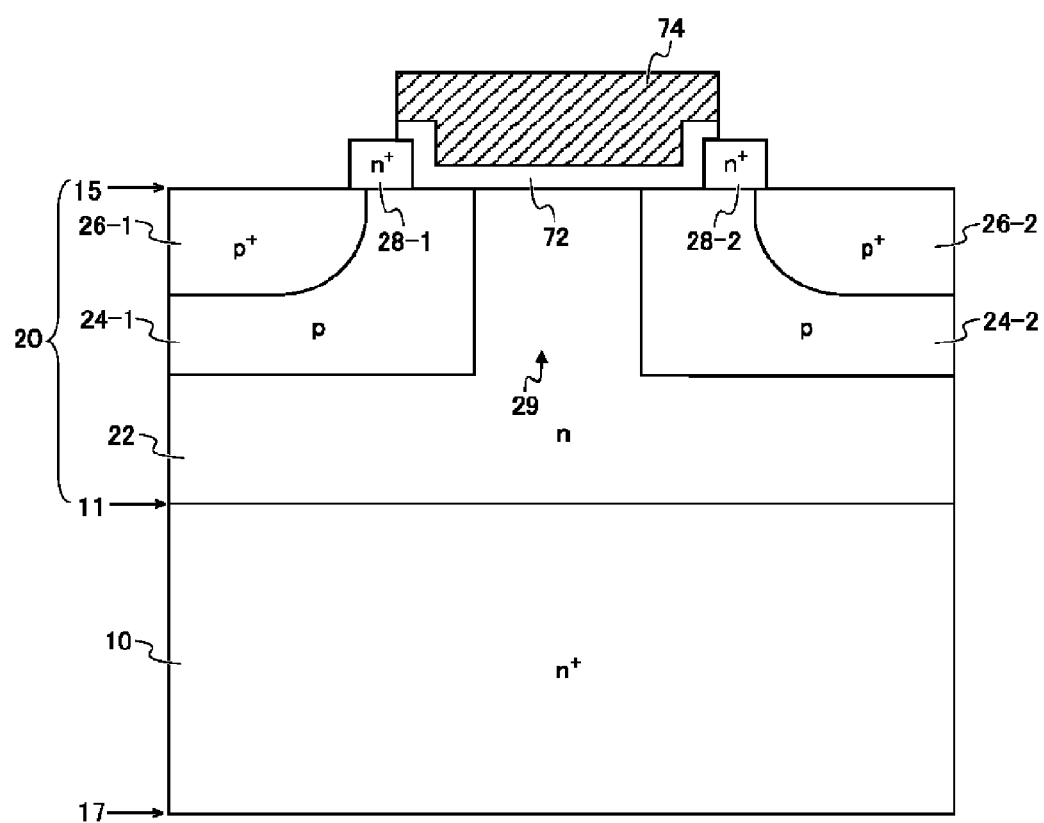
FIG. 6J shows a diagram illustrating the step S158.

FIG. 6J is a diagram illustrating the step S158. In the step S158, a gate electrode 74 is formed to be on and in direct contact with the gate insulating film 72. The gate electrode 74 may be an electrode consisting of Al (aluminum) which is formed through the evaporation method. Note that the gate electrode 74 may be a metal film of any of Al (aluminum), gold (Au), platinum (Pt) and nickel (Ni), or an alloy film or a laminated film thereof. Furthermore, the gate electrode 74 may be a polycrystalline silicon film which is doped with phosphorous or arsenic. In this example, an Al layer is patterned through the photolithographic process after the Al layer is formed. As a result, the gate electrode 74 is formed.

Figure 6K:
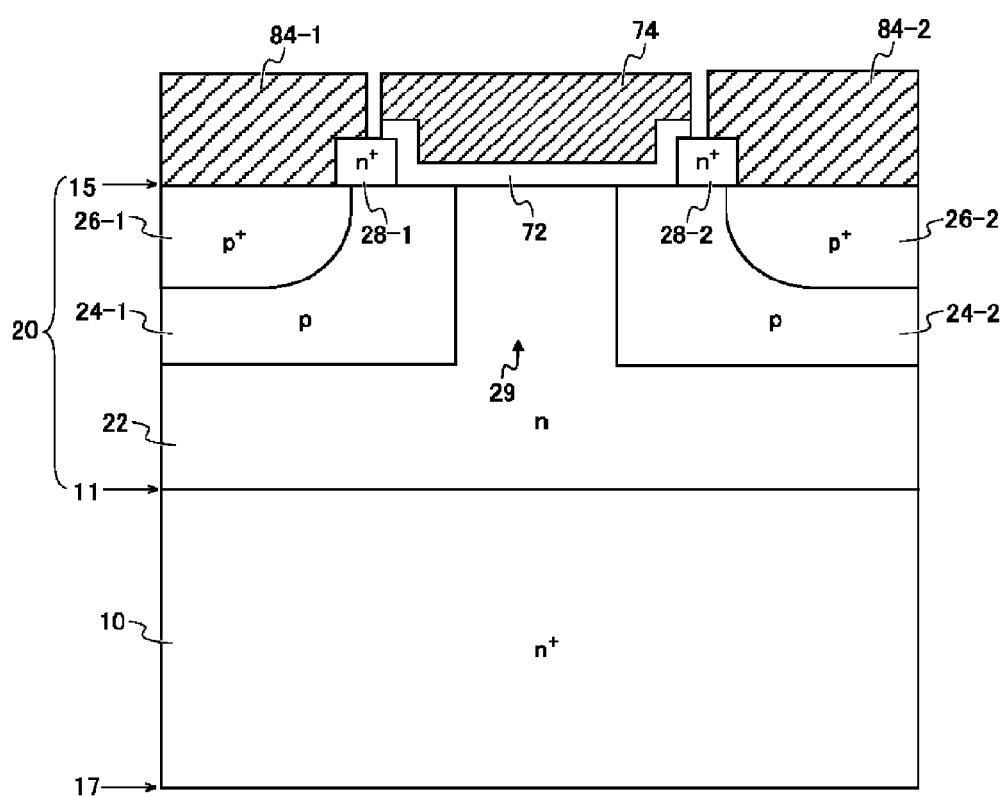
FIG. 6K shows a diagram illustrating the step S160.

FIG. 6K is a diagram illustrating the step S160. In the step S160, a source electrode 84 is formed to electrically connect to the pair of n+-type regions 28 and the p+-type region 26. The step S160 may be the same as step S60. Note that the source electrode 84 of the step S160 may also be a laminated body which has a Ti (titanium) layer as a lower layer and an Al layer as an upper layer.

Figure 6L:
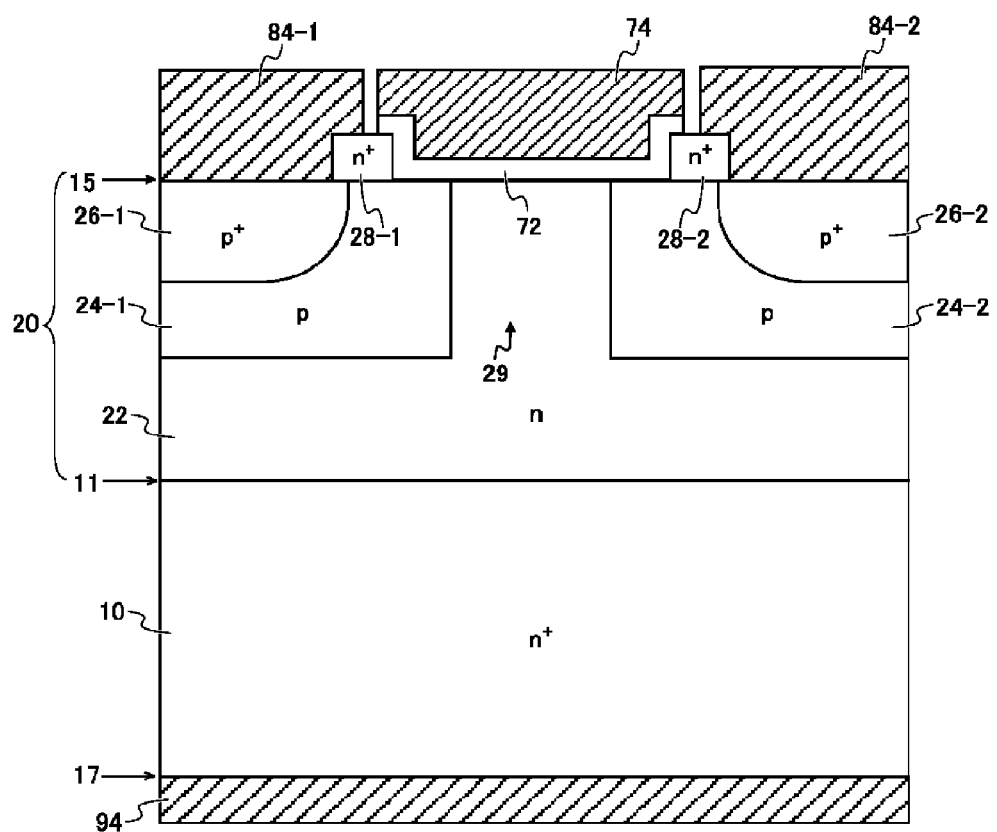
FIG. 6L shows a diagram illustrating the step S162.

FIG. 6L is a diagram illustrating the step S162. In the step S162, a drain electrode 94 is formed to be under and in direct contact with the n+-type GaN substrate 10. The drain electrode 94 may be a laminated body having a Ti layer as an upper layer in direct contact with the back surface 17 of the n+-type GaN substrate 10 and an Al layer as a lower layer. Thereafter, the vertical MOSFET 300 is completed by connecting the gate terminal 70, the source terminal 80 and the drain terminal 90 to respective electrodes.

Note that the example in which the p+-type region 16 is applied to the ohmic contact structure 100 and the example in which the p+-type region 26 is applied to the vertical MOSFET 300 are described above. However, the p+-type region 16 or the p+-type region 26 may be applied to an IGBT (Insulated Gate Bipolar Transistor) and a diode using the group-III nitride semiconductor.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: $n^+$-type GaN substrate, 11: boundary, 12: n-type GaN layer, 14: p-type GaN layer, 15: front surface, 16: $p^+$-type region, 17: back surface, 20: GaN layer, 22: lower drift layer, 24: p-type GaN layer, 25: channel forming region, 26: $p^+$-type region, 27: $n^+$-type GaN layer, 28: $n^+$-type region, 29: upper drift region, 30: Mg containing layer, 32: upper surface, 34: side surface, 40: protective film, 45: processing target laminated body, 50: annealing apparatus, 60: electrode, 70: gate terminal, 72: gate insulating film, 74: gate electrode, 80: source terminal, 84: source electrode, 90: drain terminal, 94: drain electrode, 100: ohmic contact structure, 110: photoresist film, 112: opening, 145: processing target laminated body, 200: manufacturing method, 300: MOSFET, 400: manufacturing method

What is claimed is:

1. A semiconductor device manufacturing method having a group-III nitride semiconductor substrate and a p-type group-III nitride semiconductor layer on the group-III nitride semiconductor substrate, comprising:
    forming a magnesium containing layer to be on and in direct contact with the p-type group-III nitride semiconductor layer; and
    annealing the p-type group-III nitride semiconductor layer at a temperature more than or equal to 1300° C. to form a $p^+$-type region which contains magnesium as an impurity in the p-type group-III nitride semiconductor layer located immediately below the magnesium containing layer.

2. The semiconductor device manufacturing method according to claim 1, wherein
    in the annealing, the p-type group-III nitride semiconductor layer is annealed at a temperature more than or equal to 1500° C.

3. The semiconductor device manufacturing method according to claim 1, wherein
    in the annealing, the p-type group-III nitride semiconductor layer is annealed at a temperature less than or equal to 2000° C.

4. The semiconductor device manufacturing method according to claim 1, further comprising after the forming a magnesium containing layer and before the forming a $p^+$-type region, forming a protective film on the p-type group-III nitride semiconductor layer and the magnesium containing layer.

5. The semiconductor device manufacturing method according to claim 4, wherein
    the protective film covers an upper surface and side surfaces of the magnesium containing layer and an upper surface of the p-type group-III nitride semiconductor layer.

6. The semiconductor device manufacturing method according to claim 4, wherein
    the protective film has any one of aluminum nitride, boron nitride and other high melting point materials.

7. The semiconductor device manufacturing method according to claim 4 further comprising:
    after the forming a $p^+$-type region,
    removing the protective film; and
    removing the magnesium containing layer.

8. The semiconductor device manufacturing method according to claim 1, wherein
    the group-III nitride semiconductor substrate has a threading dislocation density less than $10^7$ cm$^{-2}$.

9. The semiconductor device manufacturing method according to claim 1, wherein
    the $p^+$-type region has a magnesium concentration more than or equal to 1E+18 cm$^{-3}$ and less than or equal to 1E+21 cm$^{-3}$.

10. The semiconductor device manufacturing method according to claim 1, further comprising:
    before the forming a p-type group-III nitride semiconductor layer, forming an n-type group-III nitride semiconductor layer between the group-III nitride semiconductor substrate and the p-type group-III nitride semiconductor layer;
    after the forming a p-type group-III nitride semiconductor layer, forming an $n^+$-type group-III nitride semiconductor layer on the p-type group-III nitride semiconductor layer;
    after the forming an $n^+$-type group-III nitride semiconductor layer and before the forming a magnesium containing layer, forming a pair of $n^+$-type regions on a further inner side than the pair of $p^+$-type regions in a cross section perpendicular to a front surface of the semiconductor layer by partially removing the $n^+$-type group-III nitride semiconductor layer;
    after the forming a $p^+$-type region, forming an n-type region in the p-type group-III nitride semiconductor layer by implanting n-type impurities into a position in the p-type group-III nitride semiconductor layer, the position being between the pair of $n^+$-type regions and other than the $p^+$-type region;
    after the forming an n-type region, forming a gate insulating film on the n-type region;
    after the forming a gate insulating film, forming a gate electrode to be on and in direct contact with the gate insulating film;
    after the forming an n-type region, forming a source electrode to electrically connect to the pair of $n^+$-type regions and the $p^+$-type region; and
    after the forming an n-type region, forming a drain electrode to be under and in direct contact with the group-III nitride semiconductor substrate.

* * * * *